(12) United States Patent
Kim et al.

(10) Patent No.: US 9,410,017 B2
(45) Date of Patent: Aug. 9, 2016

(54) POLY-AMIC ACID, PHOTO-SENSITIVE RESIN COMPOSITION, DRY FILM, AND CIRCUIT BOARD

(71) Applicant: LG CHEM, LTD., Seoul (KR)

(72) Inventors: Jung-Hak Kim, Daejeon (KR); You-Jin Kyung, Daejeon (KR); Hee-Jung Kim, Daejeon (KR); Kwang-Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 221 days.

(21) Appl. No.: 14/115,201

(22) PCT Filed: May 3, 2013

(86) PCT No.: PCT/KR2013/003864
§ 371 (c)(1),
(2) Date: Nov. 1, 2013

(87) PCT Pub. No.: WO2013/165211
PCT Pub. Date: Nov. 7, 2013

(65) Prior Publication Data
US 2014/0296362 A1    Oct. 2, 2014

(30) Foreign Application Priority Data

May 3, 2012 (KR) .......................... 10-2012-0046942
May 3, 2013 (KR) .......................... 10-2013-0049734

(51) Int. Cl.
| | |
|---|---|
| C08F 2/46 | (2006.01) |
| C08F 2/50 | (2006.01) |
| B29C 71/04 | (2006.01) |
| C08G 61/04 | (2006.01) |
| C08G 73/10 | (2006.01) |
| H05K 3/28 | (2006.01) |
| G03F 7/037 | (2006.01) |
| G03F 7/038 | (2006.01) |
| G03F 7/40 | (2006.01) |

(52) U.S. Cl.
CPC ............... *C08G 73/10* (2013.01); *G03F 7/037* (2013.01); *G03F 7/0387* (2013.01); *G03F 7/40* (2013.01); *H05K 3/287* (2013.01); *H05K 2201/0154* (2013.01)

(58) Field of Classification Search
CPC ............. H05K 1/0393; H05K 1/0346; H05K 2201/0154; H05K 3/287; C08G 73/10; G03F 7/037; G03F 7/40; G03F 7/0387

USPC ......... 522/30, 7, 6, 71, 189, 184, 1, 176, 173; 520/1

See application file for complete search history.

(56) References Cited

U.S. PATENT DOCUMENTS

2011/0054124 A1    3/2011   Chang et al.

FOREIGN PATENT DOCUMENTS

| | | | |
|---|---|---|---|
| CN | 1258187 | A | 6/2000 |
| CN | 101124270 | A | 2/2008 |
| CN | 101495915 | A | 7/2009 |
| CN | 102361913 | A | 2/2012 |
| JP | 2000186143 | A | 7/2000 |
| JP | 2000212280 | A | 8/2000 |
| JP | 2000338668 | A | 12/2000 |
| JP | 2004-25610 | A | 1/2004 |
| JP | 2005326579 | A | 11/2005 |
| JP | 2007233319 | A | 9/2007 |
| JP | 2012527009 | A | 11/2012 |
| KR | 10-2001-0062506 | A | 7/2001 |
| KR | 10-2001-0077251 | A | 8/2001 |
| KR | 10-2010-0040269 | A | 4/2010 |
| KR | 10-1010036 | B1 | 1/2011 |
| KR | 10-2011-0023814 | A | 3/2011 |
| KR | 10-2011-0045779 | A | 5/2011 |
| WO | 2004/018545 | A1 | 3/2004 |
| WO | 2010/036873 | A1 | 4/2010 |
| WO | 2010-050523 | * | 5/2010 |
| WO | 2011/025307 | A2 | 3/2011 |

OTHER PUBLICATIONS

Sakumoto, WO 2010-050523 Machine Translation, May 6, 2010.*

\* cited by examiner

*Primary Examiner* — Ling Choi
*Assistant Examiner* — Jessica E Whiteley
(74) *Attorney, Agent, or Firm* — Rothwell, Figg, Ernst & Manbeck, P.C.

(57) ABSTRACT

The present invention relates to a novel polyamic acid introduced with an imidazolyl group in the polymer chain, a photosensitive resin composition including the polyamic acid and that is capable of providing a photosensitive material that satisfies the characteristics of an excellent bending property and low stiffness and also exhibits excellent heat resistance and coating resistance, a dry film obtained from the photosensitive resin composition, and a circuit board including the dry film.

17 Claims, No Drawings

POLY-AMIC ACID, PHOTO-SENSITIVE RESIN COMPOSITION, DRY FILM, AND CIRCUIT BOARD

CROSS REFERENCE TO RELATED APPLICATIONS

This application is a 35 U.S.C. §371 National Phase Entry Application from PCT/KR2013/003864, filed May 3, 2013, and designating the United States, which claims priority under 35 U.S.C. §119 to Korean Patent Application No. 10-2012-0046942 filed May 3, 2012 and to Korean Patent Application No. 10-2013-0049734 filed May 3, 2013, which are incorporated herein in their entireties.

TECHNICAL FIELD

The present invention relates to a novel polyamic acid, a photosensitive resin composition, a dry film, and a circuit board.

More particularly, the present invention relates to a novel polyamic acid, a photosensitive resin composition capable of providing a photosensitive material that satisfies the characteristics of an excellent bending property and low stiffness and exhibits excellent heat resistance and coating resistance, a dry film obtained from the photosensitive resin composition, and a circuit board including the dry film.

BACKGROUND OF THE ART

A solder resist (or protective film) is a protective film for a circuit pattern that is formed on the outermost surface of a print substrate, and stringent precision requirements have arisen from current trends of high-precision printed circuit boards.

Recently, a photosensitive protective film (photoimageable coverlay) for a circuit board has been used in a photolithography process using a photosensitive resin composition in order to improve a fine circuit pattern and precise positioning.

In general, the photosensitive protective film for a circuit board is prepared by thermally compressing a liquid or film type of photosensitive resin composition on a circuit of a copper clad laminate (CCL), exposing it to UV along the pattern, developing it with a developing agent, washing it, drying it, and performing thermal curing. Then, fine holes required to connect a circuit can be formed precisely at desired positions.

The conventional solder resist for a circuit board was obtained from a photosensitive resin composition prepared by adding an acrylate to an epoxy resin.

However, such a conventional photosensitive resin composition can be discolored or delaminated from the circuit in a soldering process due to poor flame retardancy or poor heat resistance after curing. Additionally, the resin composition is not suitable for a photosensitive protective film of the circuit board because it cannot be applied to regions requiring repeated foldings due to its insufficient flexibility and bending resistance.

In order to improve flame retardancy or heat resistance of the conventional photosensitive resin composition, bromine-containing aromatic compounds or antimony compounds have been further added. However, these added substances create dioxins when burned or they in themselves are harmful to the human body, and thus, there is a difficulty in meeting current stringent regulatory requirements.

Accordingly, there has been a demand for a photosensitive resin composition that is excellent in heat resistance, flame retardancy, bending property, and insulation reliability, and that is environmentally friendly and harmless to the human body. In recent years, polyimides or a precursor thereof has been actively used.

In detail, since polyimides and precursors thereof have excellent durability, heat resistance, flame retardancy, and mechanical and electronic properties, they are actively used as a base film of a printed circuit board, as well as a cover film for a highly integrated semiconductor device or a highly integrated multilayered wiring board. Thus, a polyimide photosensitive resin has been highly demanded because the problems of the conventional photosensitive protective films can be overcome or solved.

In spite of the demand, there are several obstacles in using a polyimide as a material for the photosensitive circuit protective film.

Specifically, in application of the polyimide photosensitive resin, a polyamic acid, which is a precursor of a polyimide, is used so as to increase the formability. However, polyimidization of the polyamic acid requires a high temperature of 350° C. or higher.

Therefore, if it is polyimidized through a heat curing process while it is applied onto the circuit pattern in a polyamic acid form or attached in a film form, there are problems that a copper circuit that is vulnerable to heat may be undesirably oxidized and deteriorated.

Moreover, to achieve appropriate properties, a polyimide is required to have a predetermined molecular weight. If the molecular weight is increased, compatibility with other substances is reduced, it is hard to realize the developing property with respect to the weak alkaline aqueous solution, and the space-filling capability is reduced due to a high modulus. Thus, there is a limit in development of a circuit protective film that is made of a polyimide as the photosensitive protective film.

DETAILED DESCRIPTION OF THE INVENTION

Technical Objectives

The present invention provides a novel polyamic acid.

Further, the present invention provides a photosensitive resin composition capable of providing a photosensitive material that satisfies the characteristics of an excellent bending property and low stiffness and that exhibits excellent heat resistance and coating resistance.

The present invention also provides a dry film obtained from the photosensitive resin composition.

In addition, the present invention provides a circuit board including the dry film.

Technical Solutions

The present invention provides a polyamic acid including a repeating unit of the specific structure.

Further, the present invention provides a photosensitive resin composition including a polyamic acid-containing polymer resin; a crosslinking agent; an organic solvent; and a photopolymerization initiator.

The present invention also provides a dry film including a cured product of the photosensitive resin composition.

In addition, the present invention provides a circuit board including the dry film.

Hereinafter, a polyamic acid, a photosensitive resin composition, a dry film, and a circuit board according to specific embodiments of the present invention will be described in more detail.

According to one embodiment, the present invention provides a polyamic acid including a repeating unit of Chemical Formula 1.

[Chemical Formula 1]

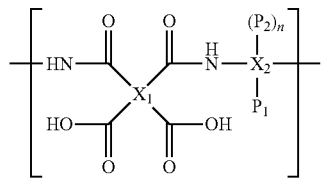

In Chemical Formula 1, $X_1$ is a tetravalent organic group, $X_2$ is an aromatic ring-containing trivalent or tetravalent organic group, n is an integer of 0 or 1, and $P_1$ and $P_2$ are the same or different and are each an organic functional group containing an imidazolyl group.

The present inventors newly synthesized the polyamic acid including the repeating unit of Chemical Formula 1 by reacting a specific diamine substituted with an imidazolyl group and tetracarboxylic acid dianhydride.

As described in the after-mentioned photosensitive resin composition, use of the photosensitive resin composition applied with the polyamic acid including the repeating unit of Chemical Formula 1 allows low-temperature curing, thereby providing process stability and operational convenience, and providing a photosensitive material that satisfies the characteristics of an excellent bending property and low stiffness and that exhibits excellent heat resistance and coating resistance.

In Chemical Formula 1, $X_2$ may be an aromatic ring-containing trivalent or tetravalent organic group. As $X_2$ has the aromatic ring, for example, including an aryl group having 6 to 20 carbon atoms, a polyimide or a polymer compound prepared from the polyamic acid may have superior heat resistance and obtain the characteristics of a high bending property and low stiffness.

In Chemical Formula 1, $X_2$ may preferably be one tetravalent organic group selected from the group consisting of the following Chemical Formulae 11 to 15, or one trivalent organic group selected from the group consisting of the following Chemical Formulae 16 to 20.

In this regard, when $X_2$ is a trivalent organic group, n is 0.

In the following Chemical Formulae 11 to 20, a line drawn through the aromatic ring indicates that a substituent can be attached to the aromatic ring at any of the available bonding points.

[Chemical Formula 11]

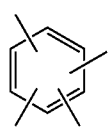

[Chemical Formula 12]

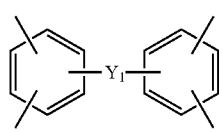

In Chemical Formula 12, $Y_1$ is a direct bond, —O—, —CO—, —S—, —$SO_2$—, —C($CH_3$)$_2$—, —C($CF_3$)$_2$—, —CONH—, —COO—, —($CH_2$)$_{n1}$—, —O($CH_2$)$_{n2}$O—, or —OCO($CH_2$)$_{n3}$OCO—, and n1, n2, and n3 are an integer of 1 to 10, respectively.

[Chemical Formula 13]

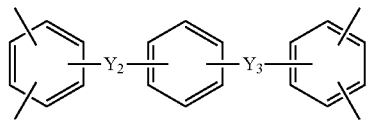

In Chemical Formula 13, $Y_2$ and $Y_3$ may be the same or different, and are each a direct bond, —O—, —CO—, —S—, —$SO_2$—, —C($CH_3$)$_2$—, —C($CF_3$)$_2$—, —CONH—, —COO—, —($CH_2$)$_{n1}$—, —O($CH_2$)$_{n2}$O—, or —OCO($CH_2$)$_{n3}$OCO—, and n1, n2, and n3 are an integer of 1 to 10, respectively.

[Chemical Formula 14]

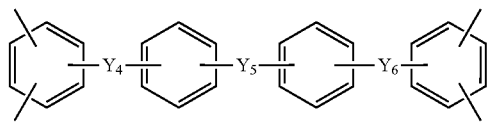

In Chemical Formula 14, $Y_4$, $Y_5$ and $Y_6$ may be the same or different, and are each a direct bond, —O—, —CO—, —S—, —$SO_2$—, —C($CH_3$)$_2$—, —C($CF_3$)$_2$—, —CONH—, —COO—, —($CH_2$)$_{n1}$—, —O($CH_2$)$_{n2}$O—, or —OCO($CH_2$)$_{n3}$OCO—, and n1, n2, and n3 are an integer of 1 to 10, respectively.

[Chemical Formula 15]

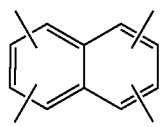

[Chemical Formula 16]

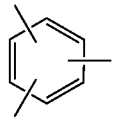

[Chemical Formula 17]

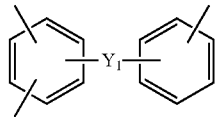

In Chemical Formula 17, $Y_1$ is a direct bond, —O—, —CO—, —S—, —$SO_2$—, —C($CH_3$)$_2$—, —C($CF_3$)$_2$—, —CONH—, —COO—, —($CH_2$)$_{n1}$—, —O($CH_2$)$_{n2}$O—, or —OCO($CH_2$)$_{n3}$OCO—, and n1, n2, and n3 are an integer of 1 to 10, respectively.

[Chemical Formula 18]

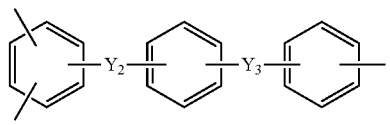

In Chemical Formula 18, $Y_2$ and $Y_3$ are the same or different, and are each a direct bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, or —$OCO(CH_2)_{n3}OCO$—, and n1, n2, and n3 are an integer of 1 to 10, respectively.

[Chemical Formula 19]

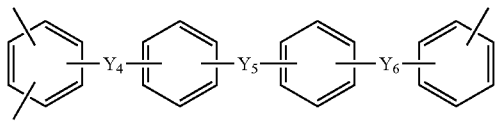

In Chemical Formula 19, $Y_4$, $Y_5$, and $Y_6$ may be the same or different, and are each a direct bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, or —$OCO(CH_2)_{n3}OCO$—, respectively and n1, n2, and n3 are an integer of 1 to 10, respectively.

[Chemical Formula 20]

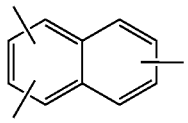

Meanwhile, as described above, $P_1$ and $P_2$ in Chemical Formula 1 may be the same or different, and are each an organic functional group containing an imidazolyl group.

Imidazole compounds function to prevent corrosion and to improve adhesion to a metal, thereby improving adhesion to a copper clad, and also function to catalyze imidization of the polyamic acid to allow the low-temperature curing during preparation of the photosensitive material.

However, according to the experimental results of the present inventors, when the imidazole compounds are added in a single molecular form to the photosensitive resin composition or the like, its compatibility with polyamic acid is poor, resulting in irregular or non-uniform dispersion in the composition or the like. Thus, it is difficult to obtain uniform physical properties of the photosensitive material prepared therefrom, or partial fouling of the circuit board or the like may be caused.

Therefore, the present inventors introduced the imidazolyl group to the branch of the polyamic acid polymer to solve the problems regarding the compatibility with polyamic acid or dispersibility in the photosensitive resin composition, and they found that use of the imidazolyl group-introduced polyamic acid polymer allows the low-temperature curing with high efficiency, provides high adhesive strength to the metal such as copper clad or the like, and provides an excellent corrosion-preventing function to achieve excellent coating resistance.

The use of the polyamic acid of one embodiment provides a more homogenous photosensitive resin composition and a material having more uniform and superior physical properties for a dry film or the like, compared to addition of the imidazole compound in an additive form to the photosensitive resin composition. The photosensitive resin composition and the material obtained therefrom may have high adhesive strength, an excellent bending property, excellent solder heat resistance, a relatively low coefficient of thermal expansion, high hot moisture resistance, high elasticity, and excellent coating resistance.

Each of $P_1$ and $P_2$ may include a carbonyl group and an imidazolyl group-binding functional group at the end.

Specifically, each of $P_1$ and $P_2$ in Chemical Formula 1 is preferably a functional group of the following Chemical Formula 2.

—$(R_1)_a$—$(R_2)_b$—Y  [Chemical Formula 2]

In Chemical Formula 2, $R_1$ is

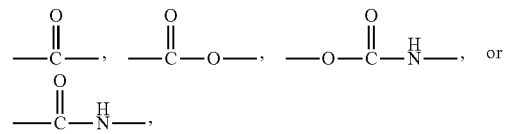

a is 0 or 1, $R_2$ is a straight or branched alkylene having 1 to 10 carbon atoms, b is 0 or 1, and Y is an imidazolyl group that is substituted or unsubstituted with an alkyl group having 1 to 3 carbon atoms.

As used herein, the term "alkylene group" refers to a divalent functional group derived from a straight or branched alkane.

Y may be a functional group of the following Chemical Formulae 51 to 53.

[Chemical Formula 51]

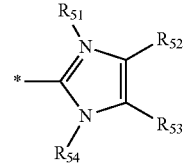

[Chemical Formula 52]

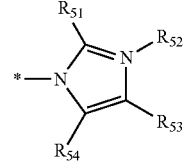

[Chemical Formula 53]

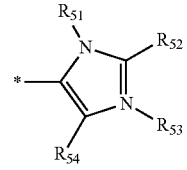

In Chemical Formulae 51 to 53, $R_{51}$, $R_{52}$, $R_{53}$, and $R_{54}$ may be the same or different, and may be hydrogen or an alkyl group having 1 to 3 carbon atoms, respectively, and * indicates the bonding point of a functional group.

Meanwhile, $X_1$ in Chemical Formula 1 may be a tetravalent organic group, and the type of the applicable tetravalent organic group is preferably, but is not particularly limited to, one tetravalent organic group selected from the group consisting of the following Chemical Formulae 21 to 35.

[Chemical Formula 21]

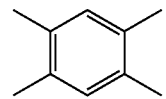

[Chemical Formula 22]

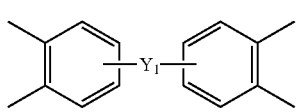

In Chemical Formula 22, Y$_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively.

[Chemical Formula 23]

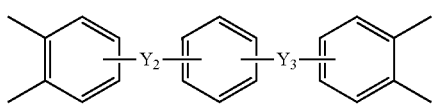

In Chemical Formula 23, Y$_2$ and Y$_3$ may be the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively.

[Chemical Formula 24]

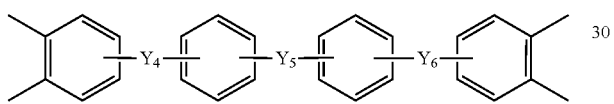

In Chemical Formula 24, Y$_4$, Y$_5$ and Y$_6$ may be the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively.

[Chemical Formula 25]

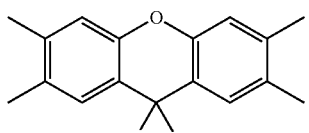

[Chemical Formula 26]

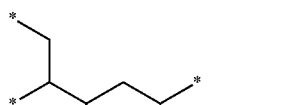

[Chemical Formula 27]

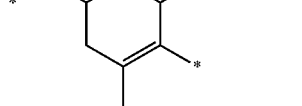

In Chemical Formulae 26 and 27, * indicates the bonding point of a functional group.

[Chemical Formula 28]

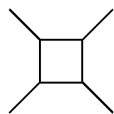

[Chemical Formula 29]

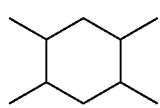

[Chemical Formula 30]

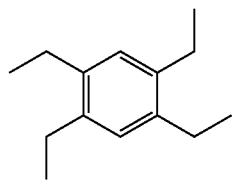

[Chemical Formula 31]

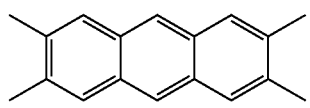

[Chemical Formula 32]

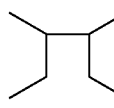

[Chemical Formula 33]

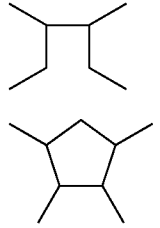

[Chemical Formula 34]

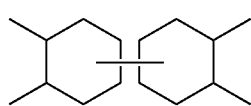

[Chemical Formula 35]

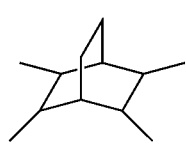

Meanwhile, the polyamic acid may further include a repeating unit of a general polyamic acid, for example, a repeating unit of the following Chemical Formula 3, in addition to the repeating unit of the above Chemical Formula.

[Chemical Formula 3]

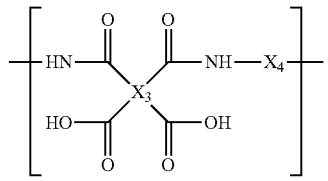

In Chemical Formula 3, X$_3$ is a tetravalent organic group, and X$_4$ is a divalent organic group.

The type of the tetravalent organic group applicable to X$_3$ is preferably, but is not particularly limited to, independently one tetravalent organic group selected from the group consisting of Chemical Formulae 21 to 35.

In terms of compatibility with a photocrosslinking agent, it is preferable that the structure or characteristics of the repeating unit of Chemical Formula 3 allows the polyamic acid including the same to have a glass transition temperature of 250° C. or less when the polyamic acid is polyimidized.

Further, the divalent organic group applicable to $X_4$ is preferably, but is not particularly limited to, independently one divalent functional group selected from the group consisting of the following Chemical Formulae 60 to 68.

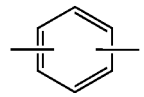

[Chemical Formula 60]

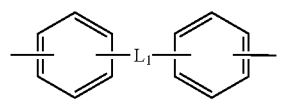

[Chemical Formula 61]

In Chemical Formula 61, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or COO(CH$_2$)$_{n3}$OCO—, and n1, n2, and n3 are an integer of 1 to 10, respectively.

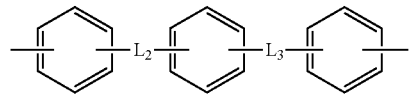

[Chemical Formula 62]

In Chemical Formula 62, $L_2$ and $L_3$ may be the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O— or —OCO(CH$_2$)$_{n3}$OCO—, and n1, n2, and n3 are an integer of 1 to 10, respectively.

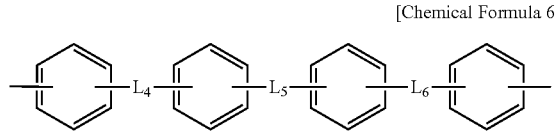

[Chemical Formula 63]

In Chemical Formula 63, $L_4$, $L_5$, and $L_6$ may be the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, and n1, n2, and n3 are an integer of 1 to 10, respectively.

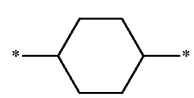

[Chemical Formula 64]

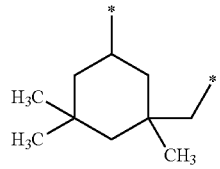

[Chemical Formula 65]

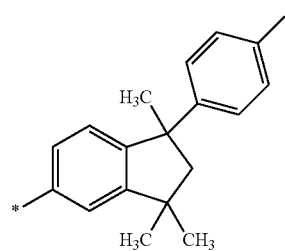

[Chemical Formula 66]

In Chemical Formulae 64, 65, and 66, * indicates the bonding point.

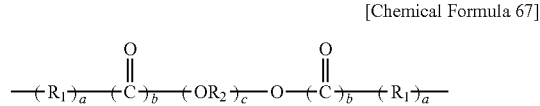

[Chemical Formula 67]

In Chemical Formula 67, $R_1$ is alkylene or arylene having 2 to 8 carbon atoms, $R_2$ is an alkylene having 2 to 8 carbon atoms, a and b are 0 or 1, respectively, and c is an integer of 1 to 21.

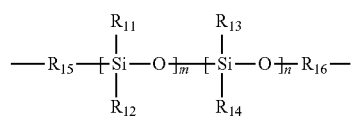

[Chemical Formula 68]

In Chemical Formula 68, $R_{11}$, $R_{12}$, $R_{13}$, and $R_{14}$ may be the same or different, and are each an alkyl group having 1 to 5 carbon atoms or an aryl group having 6 to 10 carbon atoms, respectively, $R_{15}$ and $R_{16}$ are a straight or branched alkylene group having 1 to 20 carbon atoms, respectively, m is an integer of 1 or more, and n is an integer of 0 or more.

Meanwhile, the polyamic acid may include 0.1 to 50 mol % of the repeating unit of Chemical Formula 1, and 50 to 99.9 mol % of the repeating unit of Chemical Formula 3.

The polyamic acid may preferably include 0.3 to 30 mol % of the repeating unit of Chemical Formula 1 and 70 to 99.7 mol % of the repeating unit of Chemical Formula 3, and more preferably 0.5 to 10 mol % of the repeating unit of Chemical Formula 1 and 90 to 99.5 mol % of the repeating unit of Chemical Formula 3.

If the content of the repeating unit of Chemical Formula 1 is excessively small, the photosensitive material obtained from the polyamic acid may have reduced heat resistance, copper clad adhesive strength, and coating resistance. If the content thereof is excessively large, compatibility with other photosensitive materials may be reduced or an abrupt increase in viscosity may occur, and thus workability or physical properties may be deteriorated, and the developing and bending properties may also be deteriorated.

Meanwhile, the polyamic acid may have a weight average molecular weight of 5000 to 200,000, and preferably a weight average molecular weight of 8000 to 50,000.

If the molecular weight of the polyamic acid is too low, the photosensitive resin composition may not properly function as a base resin. If the molecular weight of the polyamic acid is too high, compatibility with other materials included in the photosensitive resin composition may be reduced The polyamic acid including the repeating unit of Chemical Formula 1 may be prepared by a typical organic synthesis method known in the art.

For example, the polyamic acid may be prepared by dissolving the diamine compound of the following Chemical Formula 4 and the diamine compound of the following Chemical Formula 5 in a solvent, adding tetracarboxylic acid dianhydride to this solution, and then reacting them.

[Chemical Formula 4]

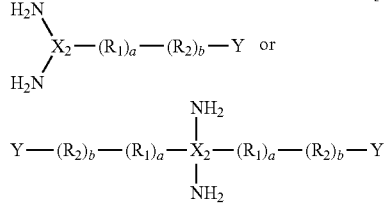

In Chemical Formula 4, $X_2$ may be the same as in the description of $X_2$ in Chemical Formula 1, and $R_1$, $R_2$, a, b, and Y may be the same as those in Chemical Formula 2.

$NH_2—X_4—NH_2$         [Chemical Formula 5]

In Chemical Formula 5, $X_4$ is a divalent organic group, and the type of the applicable divalent organic group is not particularly limited. Specific examples thereof are the same as described.

Examples of the diamine compound of Chemical Formula 5 may include p-PDA (p-phenylenediamine), m-PDA (m-phenylenediamine), 4,4'-ODA (4,4'-oxydianiline), 3,4'-ODA (3,4'-oxydianiline), BAPP (2,2-bis(4-[4-aminophenoxy]-phenyl)propane), APB-N (1,3-bis(3-aminophenoxy)benzene), TPE-R (1,3-bis(4-aminophenoxy)benzene), TPE-Q (1,4-bis(4-aminophenoxy)benzene), m-BAPS (2,2-bis(4-[3-aminophenoxy]phenyl)sulfone), or the like, but are not limited thereto.

As the tetracarboxylic acid dianhydride, the compound of the following Chemical Formula 6 may be used.

[Chemical Formula 6]

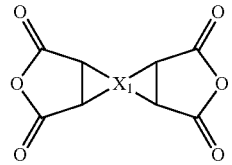

In Chemical Formula 6, $X_1$ may be a tetravalent organic group, and the type of the applicable tetravalent organic group is preferably, but is not particularly limited to, one tetravalent organic group selected from the group consisting of the following Chemical Formulae 21 to 35.

A more specific description is the same as described above.

Specific examples of the tetracarboxylic acid dianhydride may include one or more selected from the group consisting of pyromelitic dianhydride, 3,3'-4,4'-biphenyltetracarboxylic dianhydride, 3,3',4,4'-benzophenone tetracarboxylic dianhydride, 4,4'-oxydiphthalic anhydride, 4,4'-(4,4'-isopropylbiphenoxy)biphthalic anhydride), 2,2'-bis-(3,4-dicarboxylphenyl) hexafluoropropane dianhydride, TMEG (ethylene glycol bis(anhydro-trimelitate)), but are not limited thereto.

It is preferable that reaction of the multi-functional aliphatic amine compound, the diamine compound, and tetracarboxylic acid dianhydride is generally performed for approximately 24 hours at an initiation temperature of 0 to 5° C. and at a termination temperature of 10 to 40° C.

In this regard, the mixing ratio of the diamine compounds of Chemical Formula 4 and Chemical Formula 5 to tetracarboxylic acid dianhydride is preferably 1:0.9 to 1:1.1.

If the molar ratio of the diamine compounds to tetracarboxylic acid dianhydride is not within the range of 1:0.9 to 1:1.1, the molecular weight of the prepared polyamic acid is not within the appropriate range, which may cause deterioration of the mechanical properties of the obtained polyamic acid or polyimide.

The solvent used in the step of preparing the polyamic acid may be one or more selected from the group consisting of N-methylpyrrolidinone (NMP), N,N-dimethyl acetamide (DMAc), tetrahydrofuran (THF), N,N-dimethyl formamide (DMF), dimethyl sulfoxide (DMSO), cyclohexane, acetonitrile, and mixtures thereof, but is not limited thereto.

Meanwhile, according to another embodiment, the present invention provides a photosensitive resin composition including a novel polyamic acid-containing polymer resin, a photocrosslinking agent, an organic solvent, and a photopolymerization initiator.

Through experiments, the present inventors found that the use of the photosensitive resin composition including the novel polyamic acid containing the repeating unit of Chemical Formula 1 allows low-temperature curing, so as to provide process stability and operational convenience, and to provide a photosensitive material that satisfies the characteristics of an excellent bending property and low stiffness and that exhibits excellent physical properties including excellent heat resistance and coating resistance, as well as excellent copper clad adhesive strength and a high developing property, thereby completing the present invention.

A specific description of the novel polyamic acid containing the repeating unit of Chemical Formula 1 is the same as described above.

The photocrosslinking agent may be any one without limitation, as long as it is known to be typically used in the photosensitive resin composition, and a (meth)acrylate-based compound containing a double bond between carbons may be preferably used.

In the present specification, the term (meth)acrylate means an acrylate or a methacrylate, unless otherwise specified.

The (meth)acrylate-based compound containing a double bond between carbons shows high compatibility with polyamic acid, and provides a high developing property and excellent photosensitivity against an alkaline solution included in the photosensitive resin composition.

Further, if the photosensitive resin composition including the (meth)acrylate-based compound containing a double bond between carbons is processed into a dry film, it has a lower modulus when being subjected to a thermal treatment, and has fluidity when being subjected to a thermal lamination process to improve a filling property for an uneven circuit pattern. Therefore, it is possible to carry out the thermal lamination process at a relatively low temperature.

Examples of the (meth)acrylate-based compound containing a double bond between carbons that can be used as the photocrosslinking agent include, but are not particularly limited to, 2-ethylhexyl(meth)acrylate, 2-hydroxyethyl(meth) acrylate, 2-hydroxypropyl(meth)acrylate, 2-hydroxy acrylate, phenoxyethylacrylate, 2-hydroxybutyl(meth)acrylate, stearylacrylate, laurylacrylate, glycidyl(meth)acrylate, triethylene glycol diacrylate, 1,3-butanediol diacrylate, diethyleneglycol diacrylate, neopentylglycol diacrylate, 1,6-hexanediol diacrylate, 3-methyl-1,5-pentanediol diacrylate, 2-butyl-2-ethyl-1,3-propanediol acrylate, 1,9-nonanediol diacrylate, 1,6-hexanediol epoxy acrylate, pentaerythritoltri (meth)acrylate, trimethylolpropanetri(meth)acrylate, phenylglycidylester acrylate (e.g., R-128H manufactured by Nippon Kayaku Co. Ltd.), 1,6-hexanediol epoxy acrylate (e.g., Kayarad R-167 manufactured by Nippon Kayaku Co. Ltd.), tris(hydroxyethyl(meth)acryloyl)isocyanurate, polyesteracrylate, urethane acrylate, pentaerythritoltetra(meth) acrylate, or the like, and mixtures of two or more thereof may also be used.

In addition to the above compounds, the commercially available EA-1010, EA-6310, EA-1020, EA-6320, or EA-6340, which are NK oligomers manufactured by Shin-Nakamura Chemical Co., Ltd., Ebecryl 600, ZAA-205, or ZFA-266H manufactured by Nippon Kayaku Co. Ltd. may be also used.

In terms of the flexibility or bending property of the photosensitive resin composition or the product obtained therefrom, it is preferable that the photocrosslinking agent partially includes the compound of the following Chemical Formula 7.

[Chemical Formula 7]

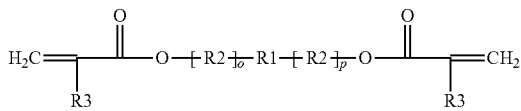

In Chemical Formula 7, R1 is an aromatic compound having two or more benzene rings in a molecule, R2 is ethyleneoxide or propyleneoxide, R3 is hydrogen or a methyl group, o and p are an integer of 2 or more, respectively, and the value of o+p is an integer of 50 or less, and preferably an integer of 30 or less.

Examples of the compound of Chemical Formula 7 may include A-BPE-10, A-BPE 20, A-BPE-30, BPE-500, BPE-900 manufactured by NK Ester, bisphenol A EO modified (meth)acrylate, bisphenol F EO modified (meth)acrylate, and PO modified (meth)acrylate manufactured by Shin-Nakamura chemical, Co., Ltd., or Kongyoungsa, Inc., SR-480, SR-602, and CD-542 manufactured by Stomer, Co., Ltd., or the like. Specific examples thereof may include ethyleneoxide modified bisphenol A di(meth)acrylate, propyleneoxide modified bisphenol A di(meth)acrylate, ethyleneoxide-propyleneoxide modified bisphenol A di(meth)acrylate, ethyleneoxide modified bisphenol F di(meth)acrylate, propyleneoxide modified bisphenol F di(meth)acrylate, ethyleneoxide-propyleneoxide modified bisphenol F di(meth)acrylate, or the like.

Meanwhile, the photopolymerization initiator may include an acetophenone-based compound, a biimidazole-based compound, a triazine-based compound, an oxime-based compound, or a mixture thereof.

Specific examples of the photopolymerization initiator may include acetophenone-based compounds such as 2-hydroxy-2-methyl-1-phenylpropan-1-on, 1-(4-isopropylphenyl)-2-hydroxy-2-methylpropan-1-on, 4-(2-hydroxyethoxy)-phenyl-(2-hydroxy-2-propyl)ketone, 1-hydroxycyclohexylphenylketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-on, 2-benzyl-2-dimethylamino-1-(4-morpholinophenyl)-butan-1-on, or 2-methyl-1-[4-(methylthio)phenyl]-2-morpholinopropan-1-on; biimidazole-based compounds such as 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, or 2,2'-bis(o-chlorophenyl)-4,4,5,5'-tetraphenyl-1,2'-biimidazole; triazine-based compounds such as 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3,-butadienyl-s-triazine, or 2-trichloromethyl-4-amino-6-p-methoxystyryl-s-triazine; oxime-based compounds such as CGI-242, CGI-124 manufactured by Chiba, Co., Ltd. in Japan; or the like.

The photosensitive resin composition may include the organic solvent for the purpose of dissolving the components of the photosensitive resin composition and providing proper viscosity before applying the composition.

Any organic solvent known to be used in the photosensitive resin composition may be used without limitation.

Examples thereof may include ketones such as methylethylketone, cyclohexanone, or the like; aromatic hydrocarbons such as toluene, xylene, tetramethylbenzene, or the like; glycol ethers (cellosolve) such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, triethylene glycol monoethyl ether, or the like; ether acetates such as ethyl acetate, butyl acetate, ethylene glycol monoethyl ether acetate, ethylene glycol monobutyl ether acetate, diethylene glycol monoethyl ether acetate, dipropylene glycol monomethyl ether acetate, or the like; alcohols such as ethanol, propanol, ethylene glycol, propylene glycol, carbitol, or the like; aliphatic hydrocarbons such as octane, decane, or the like; petroleum-based solvents such as petroleum ether, petroleum naphtha, petroleum naphtha with hydrogen, solvent naphtha, or the like; and amides such as dimethylacetamide (DMAc), dimethylformamide (DMF), or the like.

These solvents may be used alone or in a mixture of two or more thereof.

The solid content of the polymer resin including the polyamic acid may be properly determined in consideration of molecular weight, viscosity, and volatility of the polyamic acid containing the repeating unit of Chemical Formula 1, and physical properties of a final product, for example, a dry film or the like.

Preferably, the solid content of the polymer resin may be 15 to 90% by weight, based on the total weight of the photosensitive resin composition.

The content of the photocrosslinking agent may be 10 to 200 parts by weight, based on 100 parts by weight of the solid content of the polyamic acid in the photosensitive resin composition.

If the content of the photocrosslinking agent is too small, the prepared photosensitive material may have poor developing and pattern filling properties. If the content of the photocrosslinking agent is too large, the heat resistance may be worsened or the mechanical properties of the film including the folding endurance may be deteriorated.

The content of the photopolymerization initiator may be 0.1 to 10 parts by weight based on 100 parts by weight of the solid content of the polyamic acid in the photosensitive resin composition.

If the content of the photopolymerization initiator is too small, the photopolymerization initiator shows a lower degree of participation in the photo-curing. If the content of the photopolymerization initiator is too large, the physical properties of the film obtained from the photosensitive resin composition may deteriorate due to remaining radicals that have not participated in the curing reaction.

Examples of the organic solvent may be those that can easily dissolve the polyamic acid, the photocrosslinking agent, the photopolymerization initiator, or the selectively added additives. It is preferable to use a solvent that can be easily evaporated in a coating process.

The content of the organic solvent may be 100 to 1000 parts by weight based on 100 parts by weight of the solid content of the polyamic acid in the photosensitive resin composition.

If the content of the organic solvent is too small, viscosity of the photosensitive resin composition excessively increases to reduce the coating property. If the content of the organic solvent is too large, it is difficult to dry the photosensitive resin composition, and the physical properties of the film manufactured may deteriorate.

Meanwhile, the photosensitive resin composition may further include a thermal crosslinking agent, a curing accelerator, a photocrosslinking sensitizer, a curing accelerator, a phosphorus-based flame retardant, a defoaming agent, a leveling agent, and an anti-gelling agent, or mixtures thereof.

Any additive may be used without limitation, as long as it is known to be used in the photosensitive resin composition, and the proper amount thereof may be determined in consideration of physical properties of the photosensitive resin composition or the film obtained therefrom.

Meanwhile, according to still another embodiment, the present invention provides a dry film including a cured product or a dry product of the photosensitive resin composition.

As described above, the use of the photosensitive resin composition including the polyamic acid containing the repeating unit of Chemical Formula 1 provides a photosensitive material satisfying the characteristics of an excellent bending property and low stiffness and showing excellent heat resistance and coating resistance.

Specifically, the dry film means a film obtained by drying the photosensitive resin composition or a film obtained from a photo-cured or thermal-cured product of the photosensitive resin composition.

The cured product may include a crosslinked product of the polyimide containing the repeating unit of the following Chemical Formula 1-1 and the photocrosslinking agent.

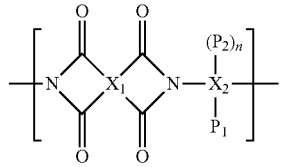

[Chemical Formula 1-1]

In Chemical Formula 1-1, $X_1$ is a tetravalent organic group, $X_2$ is an aromatic ring-containing trivalent or tetravalent organic group, n is an integer of 0 or 1, and $P_1$ and $P_2$ may be the same or different and are each an organic functional group containing an imidazolyl group.

More specifically, $X_2$ in Chemical Formula 1-1 is one tetravalent organic group selected from the group consisting of Chemical Formulae 11 to 15, or one trivalent organic group selected from the group consisting of Chemical Formulae 16 to 20.

In Chemical Formula 1-1, $X_1$ may be a tetravalent organic group, and the type of the applicable tetravalent organic group is preferably, but is not particularly limited to, one tetravalent organic group selected from the group consisting of Chemical Formulae 21 to 35.

Further, $P_1$ and $P_2$ in Chemical Formula 1-1 are preferably the functional groups of the following Chemical Formula 2, respectively.

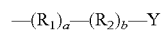

[Chemical Formula 2]

In Chemical Formula 2, $R_1$ is

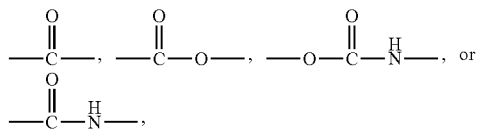

a is 0 or 1, $R_2$ is a straight or branched alkylene group having 1 to 10 carbon atoms, b is 0 or 1, and Y is an imidazolyl group that is substituted or unsubstituted with an alkyl group having 1 to 3 carbon atoms.

Y may be a functional group of Chemical Formulae 51 to 53.

The dry film may be prepared by applying the photosensitive resin composition on a support and drying it using a known method.

The photosensitive resin composition layer can be delaminated from the support, and preferably the support has excellent optical permeability.

In addition, it is preferable that the support provides good flatness.

Specific examples of the support may include various plastic films such as polyethylene terephthalate, polyethylene naphthalate, polypropylene, polyethylene, cellulose tri-acetate, cellulose di-acetate, poly(meth)acrylic acid alkyl ester, a poly(meth)acrylic acid ester copolymer, polyvinyl chloride, polyvinyl alcohol, polycarbonate, polystyrene, cellophane, a polyvinylidene chloride copolymer, polyamide, polyimide, a vinyl chloride vinyl acetate copolymer, polytetrafluoroethylene, polytrifluoroethylene, or the like.

In addition, a combination material consisting of two or more thereof may be used, and the polyethylene terephthalate film having excellent optical permeability is particularly preferred.

The thickness of the support is preferably in the range of 5 to 150 μm, and more preferably 10 to 50 μm.

The coating method of the photosensitive resin composition is not particularly limited, and for example, methods such as a spray method, a roll coating method, a rotation coating method, a slit coating method, a compression coating method, a curtain coating method, a die coating method, a wire bar coating method, and a knife coating method may be used.

Drying of the photosensitive resin composition varies according to the components or the type of the organic solvent, and the content ratio, but it is preferable that drying is carried out at 60 to 100° C. for 30 seconds to 15 minutes.

The thickness of the dry film after drying and curing is preferably in the range of 5 to 95 μm, and more preferably 10 to 50 μm.

If the thickness of the dry film is less than 5 μm, the insulating property becomes poor, and if the film thickness is more than 95 μm, the resolution may be decreased.

The dry film may be used as a protective film for a circuit board, a base film of a circuit board, an insulating layer for a circuit board, an interlayer insulating film for a semiconductor device, or a solder resist.

Meanwhile, according to still another embodiment, the present invention provides a circuit board including the dry film.

The circuit board may include a multilayer printed circuit board, a flexible circuit board, or a soft circuit board.

As described above, the dry film may be used as a protective film for a circuit board, a base film of a circuit board, an insulating layer for a circuit board, an interlayer insulating film for a semiconductor device, a solder resist, or the like.

The dry film included in the circuit board means a dry film or a processed product of the dry film, for example, a processed product laminated on a predetermined substrate or a photo-cured product.

The dry film is pre-laminated on the surface with a circuit formed thereon at a temperature of 25 to 50° C. by a flat compression method or a roll compression method, and can then be subjected to vacuum lamination at a temperature of 60 to 90° C. to form a photosensitive film.

The dry film can be patterned to form a fine hole or a fine width line by exposing it to light under a photomask.

The amount of exposure to UV varies with the type of a light source and the film thickness, but is preferably 100 to 1200 mJ/cm$^2$, and more preferably 100 to 500 mJ/cm$^2$.

Although electronic beams, UV rays, X-rays, or the like are available for active rays, UV rays are preferred.

A high-pressure mercury lamp, a low-pressure mercury lamp, a halogen lamp, or the like may be used as a light source.

For developing after the exposure, a spray method is generally used, and the photosensitive resin composition is developed using an alkaline aqueous solution such as a sodium carbonate aqueous solution or the like, and washed with water.

Thereafter, along the pattern obtained by the development through a heat treatment process, the polyamic acid is changed into polyimide. The heat treatment temperature may be in the range of 100 to 250° C. that is required for imidization.

At this time, it is more effective to increase the heating temperature continuously through 2 to 4 steps using an appropriate temperature profile, but in some cases, the curing may be carried out at a constant temperature.

By carrying out the above process, the multilayer printed circuit board, the flexible circuit board, the soft circuit board, or the like can be obtained.

Advantageous Effect of the Invention

The present invention provides a novel polyamic acid; a photosensitive resin composition capable of providing a photosensitive material that satisfies the characteristics of an excellent bending property and low stiffness and also exhibits excellent heat resistance and coating resistance; a dry film obtained from the photosensitive resin composition; and a circuit board including the dry film.

The use of the polyamic acid provides a more homogenous photosensitive resin composition and a material having more uniform and superior physical properties for a dry film or the like, and the photosensitive resin composition and the material obtained therefrom may have high adhesive strength, an excellent bending property, excellent solder heat resistance, a relatively low coefficient of thermal expansion, high hot moisture resistance, high elasticity, and excellent coating resistance.

DETAILS FOR PRACTICING THE INVENTION

Hereinafter, the present invention will be described in more detail with reference to the following examples.

However, the following examples are presented to be merely illustrative of the present invention, and they are not intended to limit the scope of the present invention.

Synthesis Example

Synthesis of (3,5-diaminophenyl)(1H-imidazol-1-yl)methanone

1. Synthesis of (3,5-dinitrophenyl)(1H-imidazol-1-yl)methanone-Chemical A of the following Reaction Scheme 1

In a 3-neck round bottom flask equipped with a stirrer, 300 g of N-methylpyrrolidone (NMP) solvent, 100 g of 3,5-dinitrobenzoic acid, 32.1 g of imidazole, and 97.5 g of N,N'-dicyclohexylcarboimide were placed and stirred homogeneously.

This solution was stirred at 70° C. for 12 hours to proceed with the reaction.

After completion of the reaction was confirmed, 800 g of ethylacetate was added as a solvent and then 10 g of a 10% hydrochloric acid solution was added and stirred for 10 minutes.

The resulting product was then washed with water to remove a salt and N-methylpyrrolidone therefrom, and Chemical A was obtained through distillation under a reduced pressure.

2. Synthesis of (3,5-diaminophenyl)(1H-imidazol-1-yl)methanone 100 g of Chemical A obtained was dissolved in 300 g of a methylene chloride solution, 10 g of palladium charcoal was added thereto, and the resultant was stirred under a hydrogen atmosphere at 3 atm for 12 hours.

After completion of the reaction was confirmed, palladium charcoal was removed using a vacuum filter to give a final product (3,5-diaminophenyl)(1H-imidazol-1-yl)methanone.

The synthesis was carried out through the steps of the following Reaction Scheme 1.

[Reaction Scheme 1]

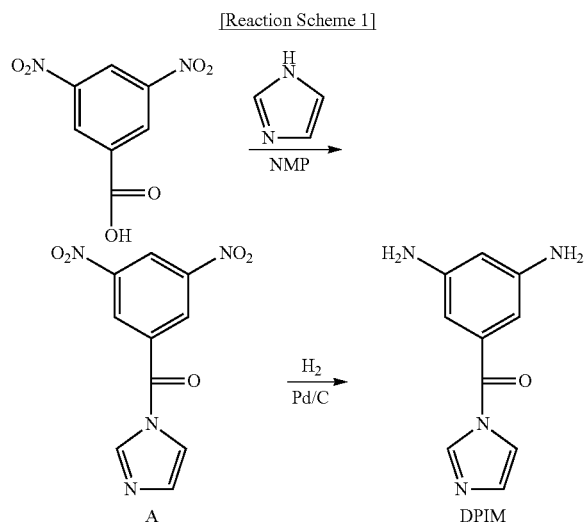

Preparation Example

Preparation of Polyamic Acid

Preparation Example 1

Preparation of Polyamic Acid (PAA1)

In a 4-neck round bottom flask equipped with a thermometer, a stirrer, a nitrogen input port, and a powder dispensing funnel, 38 g of 4,4'-oxydiphthalic anhydride (ODPA) was dispersed in 150 g of a mixed solvent of toluene and dimethyl acetamide (weight ratio: 3:7) with nitrogen flowing therein.

Then, 23.2 g of 4,4'-oxydianiline (4,4'-ODA) and 2.59 g of DPIM obtained in the synthesis example were completely dissolved in the solution while stirring, and the resultant was further stirred for 24 hours to give a polyamic acid varnish.

The solid content of the varnish solution was 30 wt % and the viscosity thereof was 3400 cps at room temperature.

Preparation Example 2

Preparation of Polyamic Acid (PAA2)

In a 4-neck round bottom flask equipped with a thermometer, a stirrer, a nitrogen input port, and a powder dispensing funnel, 38 g of 4,4'-oxydiphthalic anhydride (ODPA) was dispersed in 149 g of a mixed solvent of toluene and dimethyl acetamide (weight ratio: 3:7) with nitrogen flowing therein.

Then, 20.6 g of 4,4'-oxydianiline (4,4'-ODA) and 5.19 g of DPIM obtained in the synthesis example were completely dissolved in the solution while stirring, and the resultant was further stirred for 24 hours to give a polyamic acid varnish.

The solid content of the varnish solution was 30 wt % and the viscosity thereof was 3600 cps at room temperature.

Preparation Example 3

Preparation of Polyamic Acid (PAA3)

In a 4-neck round bottom flask equipped with a thermometer, a stirrer, a nitrogen input port, and a powder dispensing funnel, 38 g of 4,4'-oxydiphthalic anhydride (ODPA) was dispersed in 149 g of a mixed solvent of toluene and dimethyl acetamide (weight ratio: 3:7) with nitrogen flowing therein.

Then, 25.8 g of 4,4'-oxydianiline (4,4'-ODA) was completely dissolved in the reaction solution while stirring, and the resultant was further stirred for 24 hours to give a polyamic acid varnish.

The solid content of the varnish solution was 30 wt % and the viscosity thereof was 3100 cps at room temperature.

Example and Comparative Example

Preparation of Photosensitive Resin Composition

Example 1 and Example 2

With respect to 100 parts by weight (based on the solid content) of the polyamic acid varnish obtained in Preparation Examples 1 and 2, each component shown in Table 1 was mixed based on the mixing ratio of the solid component (parts by weight) to give a photosensitive resin composition.

Comparative Example 1

With respect to 100 part by weight (based on the solid content) of the polyamic acid varnish obtained in Preparation Example 3, each component shown in Table 1 was mixed based on the mixing ratio of the solid component (in parts by weight) to give a photosensitive resin composition.

TABLE 1

Composition of photosensitive resin composition

| Polyamic acid (30 wt % of solid component in composition) | Example 1 Preparation Example 1 (PAA1) 100 | Example 2 Preparation Example 2 (PAA2) 100 | Comparative Example 1 Preparation Example 3 (PPA3) 100 |
|---|---|---|---|
| BPE-900 | 20 | 20 | 30 |
| EA-1020 | 15 | 13 | 13 |
| DPEA-12 | 2 | 4 | — |
| GPO-303 | — | — | 4 |
| I651 | 0.88 | 0.88 | 0.88 |
| I819 | 0.59 | 0.59 | 0.59 |
| 1,2,3-triazole | 1.83 | 1.83 | 1.83 |

1) BPE-900: an ethoxylated bisphenol A methacrylate-based compound (manufactured by Shinnakamura Chemicals Co. Ltd., EO = 17)
2) EA-1020: an epoxy (meth)acrylate-based compound including at least two hydroxyl groups (manufactured by Shinnakamura Chemicals co. Ltd.)
3) DPEA-12: an EO modified dipentaerytritol hexaacrylate (manufactured by Shinnakamura Chemicals Co., Ltd.)
4) GPO-303: propoxylated glycerine triacrylate (manufactured by Shinnakamura Chemicals Co. Ltd., n = 3)
5) I651 and I819: Irgacure 651 and Irgacure 819 respectively as photopolymerization initiators
6) 1,2,4-triazole: a product of Aldrich Co. Ltd.

[Production of Test Sample]

A solution of each photosensitive resin composition obtained in the examples and the comparative example was uniformly applied onto a polyethylene terephthalate film (manufactured by Teijin Dupont Co. Ltd.) having a thickness of 25 μm used as a support film.

Then, the applied composition was dried by using a hot air convection dryer at 75° C. to form a photosensitive resin composition layer with a thickness of 38 μm after drying.

On this photosensitive resin composition layer, a polyethylene protective film (manufactured by Tamapoly Co., Ltd., trade name: NF-15) was laminated by roll compression to obtain a photosensitive element.

Experimental Example

Performance Evaluation of Dry Films of the Examples and the Comparative Example

Each of the dry films prepared in the examples and the comparative example was placed on the surface of the copper clad of a patterned 2CCL, and vacuum was applied using a MVLP-500 vacuum laminator manufactured by MEIKI Co., Ltd. at 70° C. for 20 seconds to perform vacuum lamination for 40 seconds at a pressure of 0.6 Mpa.

The resultant was exposed to 400 mJ/cm$^2$ of UV, and subjected to spray development by using a 1 wt % sodium carbonate aqueous solution for 1 minute. Curing was carried out in an oven under a nitrogen atmosphere at 160° C. for 90 minutes, and then physical properties were evaluated by the following method. The results are given in the following Table 2.

Experimental Example 1

Circuit Filling Property

After the vacuum lamination was carried out (temperature: 70° C., pressure: 0.7 MPa, vacuum time: 20 seconds, and compression time: 40 seconds), the circuit filling property of the dry film was evaluated.

Experimental Example 2

Developing Property

After the test samples prepared in the examples and the comparative example were exposed to light at 350 mJ/cm$^2$ and then developed by spraying a 1 wt % sodium carbonate aqueous solution at 35° C., it was determined whether the film can be developed to have a pitch of L/S=50 μm/50 μm.

The results of evaluating the developing property are given in the following Table 1, where "◯" represents that it is possible to develop the film, and "X" represents that it is impossible to develop the film.

Experimental Example 3

Adhesion Strength (Cross-Cut Method)

After the finally cured film of the photosensitive resin composition was obtained on the surface of the copper clad of a 2CCL product through a series of processes, its adhesion strength was evaluated with a cross-cut tape method in accordance with JIS K5400 (number of lattices attached/initial number).

Experimental Example 4

Adhesion Strength

After the finally cured film of the photosensitive resin composition was obtained on the surface of the copper clad through a series of processes, its adhesion strength was determined by peeling in accordance with JIS K5404.

Experimental Example 5

Degree of Bending (Curl, 2CCL)

After the finally cured film of the photosensitive resin composition was obtained on the surface of the copper clad of a 2CCL product through a series of processes, it was cut to a size of 200 mm×200 mm and was made to stand vertically to determine the radius of curvature of the film.

Experimental Example 6

Hot Moisture Resistance (PCT Resistance Property)

After the finally cured film of the photosensitive resin composition was obtained on the surface of the copper clad of a 2CCL product through a series of processes, it was placed under high-temperature and high-humidity (120° C., 100% RH) conditions for 5 hours before it was observed whether a color change or interface expansion occurs on the cured film.

Experimental Example 7

Solder Heat Resistance

After the dry film was floated in a solder bath with a temperature of 288±5° C. and 300±5° C. for 10 seconds with the surface of the film facing upward, it was visually inspected whether any abnormalities (delamination or deformation) occur in the dry film.

The results of solder heat resistance depending on temperature are given in the following Table 1, where "◯" represent that no delamination or deformation is visually observed at each temperature in the solder bath, and "X" represent that delamination or deformation is visually observed at each temperature in the solder bath.

Experimental Example 8

Bending Property

After the dry film was subjected to vacuum lamination on a FCCL pattern with L/S=100 μm/100 μm, exposed to light, developed, and then cured, its bending property was determined in accordance with an MIT method (0.38R, 500 g load) (JIS C6471).

Experimental Example 9

Coefficient of Thermal Expansion

The dry films prepared in the examples and the comparative example were made in a strip type of 5 mm*20 mm, and the coefficient of thermal expansion was determined by TMA (thermo-mechanical analysis) below Tg ($\alpha 1$) and above Tg ($\alpha 2$). The results are given in the following Table 2.

Experimental Example 10

Stiffness

The dry films prepared in the examples and the comparative example were subjected to vacuum lamination on an FCCL pattern with L/S=1 mm/1 mm (50% residual rate of copper wiring), exposed to light, developed, and then cured.

They were made in a loop form having a length of 10 cm and the strength at a loop diameter of 2 cm was measured using a UTM universal testing machine.

Experimental Example 11

Coating Resistance

After the dry films prepared in the examples and the comparative example were subjected to electroless nickel/gold plating, liquid permeation or delamination after electroless nickel/gold plating was visually inspected.

In Table 2, "OK" represent that no liquid permeation or delamination is visually observed after electroless nickel/gold plating, and "NG" represents that liquid permeation or delamination is visually observed after electroless nickel/gold plating.

TABLE 2

|  | Example 1 | Example 2 | Comparative Example 1 |
|---|---|---|---|
| Thickness (final, μm) | 38 | 38 | 38 |
| Post-lamination filling property | Good | Good | Good |
| Developing property (35° C.) | ○ | ○ | ○ |
| Adhesive strength <cross-cut (Cu)> | 100/100 | 100/100 | 50/100 |
| Adhesive strength <peel (gf/cm)> | 320 | 400 | 210 |
| Bending property (MIT method) | 380 | 360 | 280 |
| Radius of curvature (2CCL) | 100 | 80 | — |
| Solder (on 2CCL) Solder heat resistance | ○ | ○ | x |
| PCT | OK | OK | NG |
| CTE (a1/a2, ppm) | 60/140 | 53/132 | 80/160 |
| Stiffness (N/m) | 7 | 7.3 | 9.5 |
| Coating resistance | OK | OK | NG |

As shown in Table 2, it was found that the dry films obtained from the photosensitive resin compositions of the examples and the comparative example had a similar "post-lamination filling property" or "developing property (35° C.)" at the same thickness, but the dry films obtained from the photosensitive resin compositions of the examples had high adhesive strength, an excellent bending property, excellent solder heat resistance, a relatively low coefficient of thermal expansion, high hot moisture resistance, high elasticity, and excellent coating resistance, compared to that of the comparative example.

What is claimed is:

1. A polyamic acid comprising a repeating unit of the following Chemical Formula 1:

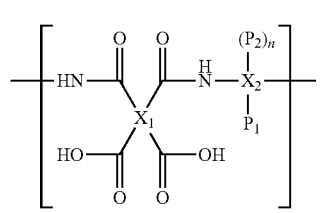

[Chemical Formula 1]

wherein $X_1$ is a tetravalent organic group,
$X_2$ is an aromatic ring-containing trivalent or tetravalent organic group,
n is an integer of 0 or 1, and $P_1$ and $P_2$ are the same or different, and are each an organic functional group containing an imidazolyl group, and wherein each of $P_1$ and $P_2$ is a functional group of the following Chemical Formula 2:

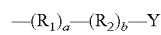

[Chemical Formula 2]

wherein $R_1$ is

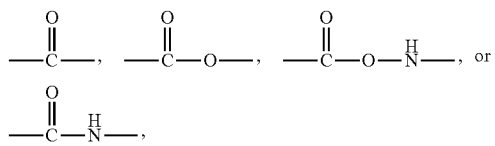

a is 0 or 1, $R_2$ is a straight or branched alkylene group having 1 to 10 carbon atoms, b is 0 or 1, and Y is an imidazolyl group that is substituted or unsubstituted with an alkyl group having 1 to 3 carbon atoms.

2. The polyamic acid according to claim 1, wherein $X_2$ is one tetravalent organic group selected from the group consisting of the following Chemical Formula 11 to 15, or one trivalent organic group selected from the group consisting of the following Chemical Formulae 16 to 20:

[Chemical Formula 11]

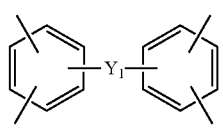

[Chemical Formula 12]

in Chemical Formula 12, $Y_1$ is a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

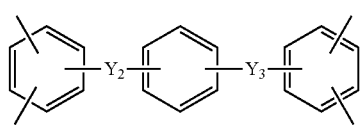

[Chemical Formula 13]

in Chemical Formula 13, $Y_2$ and $Y_3$ are the same or different, and are each a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 14]

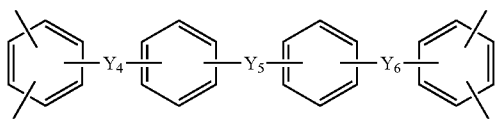

in Chemical Formula 14, $Y_4$, $Y_5$, and $Y_6$ are the same or different, and are each a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 15]

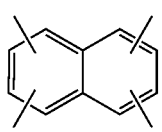

[Chemical Formula 16]

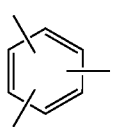

[Chemical Formula 17]

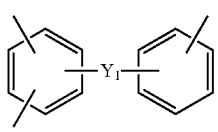

in Chemical Formula 17, $Y_1$ is a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 18]

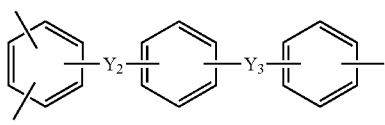

in Chemical Formula 18, $Y_2$ and $Y_3$ are the same or different, and are each a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 19]

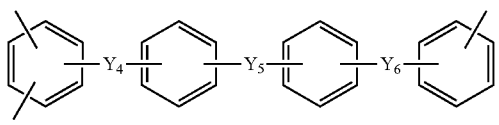

in Chemical Formula 19, $Y_4$, $Y_5$, and $Y_6$ are the same or different, and are each a direct bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 20]

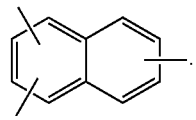

3. The polyamic acid according to claim 1, wherein each of $P_1$ and $P_2$ includes a carbonyl group and an imidazolyl group-binding functional group at the end.

4. The polyamic acid according to claim 1, wherein $X_1$ is one tetravalent organic group selected from the group consisting of the following Chemical Formulae 21 to 35:

[Chemical Formula 21]

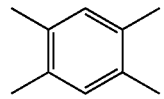

[Chemical Formula 22]

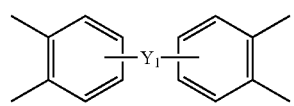

in Chemical Formula 22, $Y_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

[Chemical Formula 23]

in Chemical Formula 23, $Y_2$ and $Y_3$ are the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2 and n3 are an integer of 1 to 10, respectively,

[Chemical Formula 24]

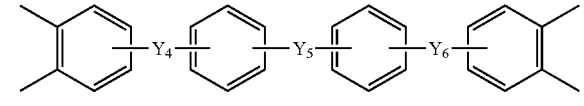

in Chemical Formula 24, $Y_4$, $Y_5$, and $Y_6$ are the same or different, and are each a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are an integer of 1 to 10, respectively,

27

[Chemical Formula 25]

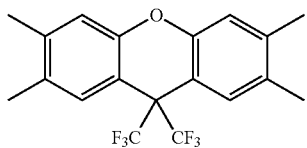

[Chemical Formula 26]

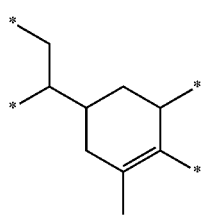

[Chemical Formula 27]

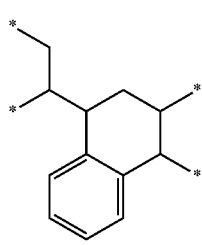

in Chemical Formula 26 and 27, * indicates the bonding point of a functional group,

[Chemical Formula 28]

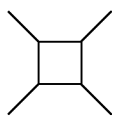

[Chemical Formula 29]

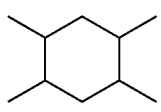

[Chemical Formula 30]

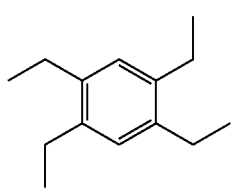

[Chemical Formula 31]

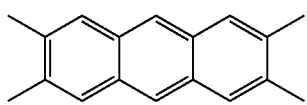

[Chemical Formula 32]

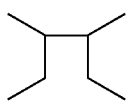

[Chemical Formula 33]

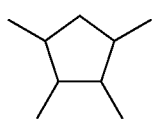

28

-continued

[Chemical Formula 34]

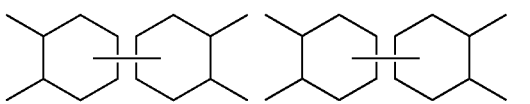

[Chemical Formula 35]

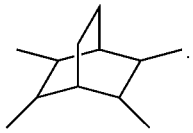

5. The polyamic acid according to claim 1, further comprising a repeating unit of the following Chemical Formula 3:

[Chemical Formula 3]

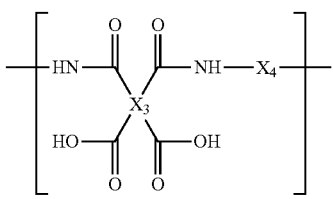

wherein $X_3$ is a tetravalent organic group and $X_4$ is a divalent organic group.

6. The polyamic acid according to claim 5, comprising 0.1 to 50 mol % of the repeating unit of Chemical Formula 1, and 50 to 99.9 mol % of the repeating unit of Chemical Formula 3.

7. The polyamic acid according to claim 1, wherein its weight average molecular weight is 5000 to 200,000.

8. A photosensitive resin composition comprising a polymer resin including the polyamic acid of claim 1, a photocrosslinking agent, an organic solvent, and a photopolymerization initiator.

9. The photosensitive resin composition according to claim 8, wherein the photocrosslinking agent includes a (meth)acrylate-based compound containing a double bond between carbons.

10. The photosensitive resin composition according to claim 8, wherein the photopolymerization initiator includes one or more compounds selected from the group consisting of an acetophenone-based compound, a biimidazole-based compound, a triazine-based compound, and an oxime-based compound.

11. The photosensitive resin composition according to claim 8, wherein the solid content of the polymer resin is 15 to 90% by weight, based on the total weight of the photosensitive resin composition.

12. The photosensitive resin composition according to claim 8, further comprising one or more additives selected from the group consisting of a thermal crosslinking agent, a curing accelerator, a photocrosslinking sensitizer, a curing accelerator, a phosphorus-based flame retardant, a defoaming agent, a leveling agent, and an anti-gelling agent.

13. A dry film comprising a cured product of the photosensitive resin composition of claim 8.

14. The dry film according to claim 13, wherein the cured product includes a crosslinked product of polyamic acid containing a repeating unit of the following Chemical Formula 1-1 and a photocrosslinking agent:

[Chemical Formula 1-1]

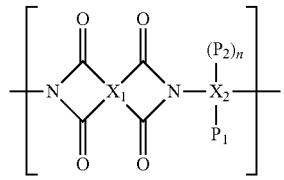

wherein $X_1$ is a tetravalent organic group,
$X_2$ is an aromatic ring-containing trivalent or tetravalent organic group,
n is an integer of 0 or 1, and
$P_1$ and $P_2$ are the same or different, and are each an organic functional group containing an imidazolyl group.

15. The dry film according to claim 13, wherein the dry film is used as a protective film for a circuit board, a base film of a circuit board, an insulating layer for a circuit board, an interlayer insulating film for a semiconductor device, or a solder resist.

16. A circuit board comprising the dry film of claim 13.

17. The circuit board according to claim 16, wherein the circuit board is a multilayer printed circuit board, a flexible circuit board, or a soft circuit board.

* * * * *